(12) United States Patent
Sakemi et al.

(10) Patent No.: US 6,394,025 B1
(45) Date of Patent: *May 28, 2002

(54) VACUUM FILM GROWTH APPARATUS

(75) Inventors: Toshiyuki Sakemi; Masaru Tanaka, both of Niihama; Shunji Wada; Etsuo Ogino, both of Tsukuba, all of (JP)

(73) Assignees: Sumitomo Heavy Industries, Ltd., Shinagawa-ku; Nippon Sheet Glass Co., Ltd., Chuo-ku, both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/027,774

(22) Filed: Feb. 23, 1998

(30) Foreign Application Priority Data

Feb. 28, 1997 (JP) .............................................. 9-046103

(51) Int. Cl.[7] .............................................. C23C 16/00
(52) U.S. Cl. ........................ 118/723 VE; 118/723 FI; 118/723 DC; 118/723 I; 118/726; 204/298.05; 204/298.06
(58) Field of Search .................. 118/723 VE, 726, 118/723 FI, 723 DC, 723 I; 204/298.05, 298.06; 335/296, 301, 302

(56) References Cited

U.S. PATENT DOCUMENTS

| | | | | |
|---|---|---|---|---|
| 3,394,217 A | * | 7/1968 | Fisk | 13/31 |
| 3,562,141 A | * | 2/1971 | Morley | 204/298 |
| 4,739,170 A | * | 4/1988 | Varga | 250/427 |
| 4,885,070 A | * | 12/1989 | Campbell et al. | 204/192.11 |
| 4,998,083 A | * | 3/1991 | Abele | 335/302 |
| 5,070,811 A | * | 12/1991 | Feuerstein et al. | 118/623 |
| 5,601,563 A | * | 2/1997 | Ito | 118/723 FE |
| 5,677,012 A | * | 10/1997 | Sakemi et al. | 427/523 |
| 5,828,173 A | * | 10/1998 | Mobius et al. | 315/5.35 |
| 5,922,180 A | * | 7/1999 | Hoshino | 204/298.06 |
| 6,077,403 A | * | 6/2000 | Kobayashi et al. | 204/192.12 |

OTHER PUBLICATIONS

Merriam–Webster's Collegiate Dictionary, Merriam–Wbster, Incorporated, Tenth Edition, p. 700.*

* cited by examiner

*Primary Examiner*—Jill Warden
*Assistant Examiner*—Kathryn Bex
(74) *Attorney, Agent, or Firm*—Burns, Doane, Swecker & Mathis, LLP

(57) ABSTRACT

A correction mechanism including a magnetic body (51) is placed at a position between a vacuum chamber (21) and a steering coil (23) and where line of magnetic force generated from the steering coil is present, to correct torsion and/or bias of a plasma beam.

4 Claims, 7 Drawing Sheets

VACUUM FILM GROWTH APPARATUS

BACKGROUND OF THE INVENTION

The present invention relates to a film growth apparatus. More specifically, the present invention relates to an improved film growth apparatus comprising a plasma source and a steering coil for use in guiding a plasma beam generated by the plasma source into a hearth serving as an anode.

Typical vacuum film growth apparatus using plasma are known as an ion plating apparatus and a plasma CVD apparatus. The known ion plating apparatus includes those using a pressure gradient plasma source or an HCD plasma source which employs arc discharge. Such ion plating apparatus comprises a vacuum chamber, a plasma beam generator (plasma source), a hearth, and a steering coil. The vacuum chamber is equipped with the plasma beam generator and the hearth disposed in the vacuum chamber as an anode. The steering coil is placed outside the vacuum chamber to guide a plasma beam generated by the plasma source into the anode. In the ion plating apparatus of the type described, the plasma beam is generated between the plasma beam generator and the hearth. The plasma beam is guided onto a vaporization material provided on the hearth to heat and evaporate the vaporization material. Evaporated particles of the vaporization material are ionized by the plasma beam. Ionized particles are deposited onto the surface of a substrate supplied with a negative voltage. As a result, a film is formed on the substrate.

The plasma beam generated by the plasma beam generator is guided by the steering coil into the hearth. However, the plasma beam has an electrical current that generates a magnetic field. The magnetic field would cause torsion or bias of the plasma beam.

The torsion or the bias prevents the plasma beam from being directed at right angles with respect to the surface of the vaporization material. As a result, various troubles may occur. For example, the vaporization material may not evaporate uniformly. The plasma density and/or temperature may be varied in a unit space. Thus, any torsion and bias should be corrected. It is known the correction can be achieved by means of adjusting an altitude of the steering coil. However, adjustment of the steering coil requires significant labor because of its large weight.

SUMMARY OF THE INVENTION

Therefore, an object of the present invention is to provide a vacuum film growth apparatus that can correct torsion and bias of a plasma beam with a simple structure.

A vacuum film growth apparatus according to the present invention comprises a vacuum chamber, a plasma source attached to the vacuum chamber, an anode placed in the vacuum chamber, and a steering coil provided outside the vacuum chamber to guide a plasma beam generated by the plasma source into the anode. The vacuum film growth apparatus guides the plasma beam to the anode and forms a film onto a substrate.

According to an aspect of the present invention, the vacuum film growth apparatus further comprises a correction mechanism placed on the steering coil or another position between the steering coil and the vacuum chamber where the line of magnetic force from the steering coil is present, to correct bias of the plasma beam.

DESCRIPTION OF THE PREFERRED EMBODIMENTS

Figure 1:
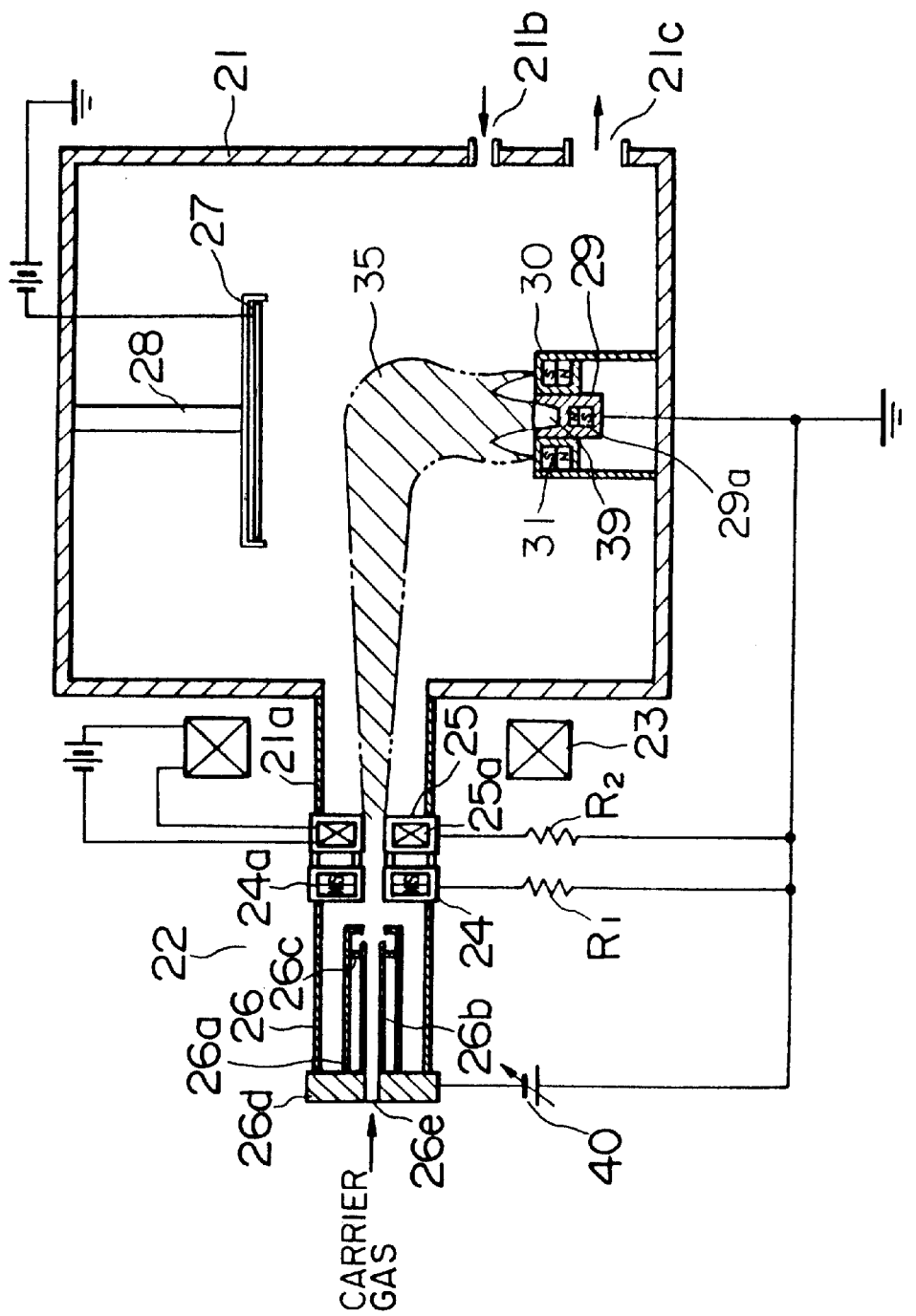
FIG. 1 is a vertical cross-sectional view of an ion plating apparatus to which the present invention can be applied.

Referring to FIG. 1, a conventional ion plating apparatus is described for the purpose of facilitating the understanding of the present invention. The ion plating apparatus has an air-tight vacuum chamber 21. The vacuum chamber 21 is equipped with a plasma beam generator 22 through a guide unit 21a. The plasma beam generator 22 may be, for example, a pressure gradient plasma gun. A steering coil 23 is placed outside the guiding unit 21a to guide a plasma beam 35. The plasma beam generator 22 is equipped with a first intermediate electrode 24 and a second intermediate electrode 25. The first and the second intermediate electrodes 24 and 25 are used for plasma beam convergence and are arranged concentrically in the plasma beam generator 22. The first intermediate electrode 24 houses a permanent magnet 24a so that a magnetic axis thereof is parallel to a central axis of the plasma beam generator 22. The second intermediate electrode 25 houses a coil 25a so that a central axis thereof coincides with the central axis of the plasma beam generator 22.

The plasma beam generator 22 has an insulator tube 26 communicated with a path defined by the first and the second intermediate electrodes 24 and 25. The insulator tube 26 may be, for example, a glass tube. A hollow cylinder 26a is placed in the glass tube 26. The cylinder 26a is made of molybdenum (Mo) and houses a pipe 26b made of tantalum (Ta). A circular plate 26c made of $LaB_6$ divides the space defined by the cylinder 26a and the pipe 26b. Respective one ends of the insulator tube 26, the cylinder 26a, and the pipe 26b are attached to a conductive section 26d. The conductive section 26d has a carrier gas inlet 26e formed therein to receive carrier gas. The carrier gas passes through the pipe 26b into the vacuum chamber 21.

A substrate 27 to be processed is placed in the vacuum chamber 21. The substrate 27 is supported by a transportation system 28. The substrate 27 is connected to a direct current power supply for negative bias. A hearth (anode) 29 is placed on the bottom of the vacuum chamber 21 and is opposed to the substrate 27. The hearth 29 houses a permanent magnet 29a. A magnet case 30 is positioned to leave a fixed space around the outer perimeter of the hearth 29. The magnet case 30 houses a permanent magnet 31.

The conductive section 26d is connected to a negative side of a variable power source 40. A positive side of the variable power source 40 is connected to the first and the second intermediate electrodes 24 and 25 through resistors R1 and R2, respectively. The hearth 29 is connected to the variable power source 40, and the resistors R1 and R2.

A gas inlet 21b and a gas exhaust outlet 21c are formed in a side wall of the vacuum chamber 21. The gas inlet 21b is for taking carrier gas such as argon (Ar) gas. The gas exhaust outlet 21c is for exhausting the gas from the vacuum chamber 21. The gas inlet 21b is connected to a gas supply which is not shown while the gas exhaust outlet 21c is connected to a gas exhaust pump which is not shown.

In the above-mentioned ion plating apparatus, discharge starts between the first intermediate electrode 24 and the cylinder 26a, when the carrier gas is introduced through the carrier gas inlet 26c. As a result, the plasma beam 35 is generated. The plasma beam 35 is guided by the steering coil 23 and the permanent magnet 31 in the magnet case 30 and reaches the hearth 29 and the magnet case 30.

When the the plasma beam 35 is given to the hearth 29, vaporization material 39 on the hearth 29 is joule heated and evaporates. Evaporated particles are ionized by the plasma beam 35. Ionized particles are deposited onto the surface of the substrate 27 to which the negative voltage is applied. As a result, a film is formed on the substrate 27.

Next, a conventional plasma CVD apparatus is described with reference to FIG. 2. The same components and parts as those in the above-mentioned ion plating apparatus are depicted by the same reference numerals. Description of such components and parts is omitted. A vacuum chamber 21' has a supply gas inlet 21b' formed in the side wall thereof to introduce supply gas. An anode 29' is placed on the bottom of the vacuum chamber 21'.

In the above-mentioned plasma CVD apparatus, the gas in the vacuum chamber 21' is exhausted and the supply gas is introduced therein through the supply gas inlet 21b'. The plasma beam 35 is generated by the plasma beam generator 22 and is guided onto the anode 29'. A film is formed on the substrate 27 by the plasma.

Figure 2:
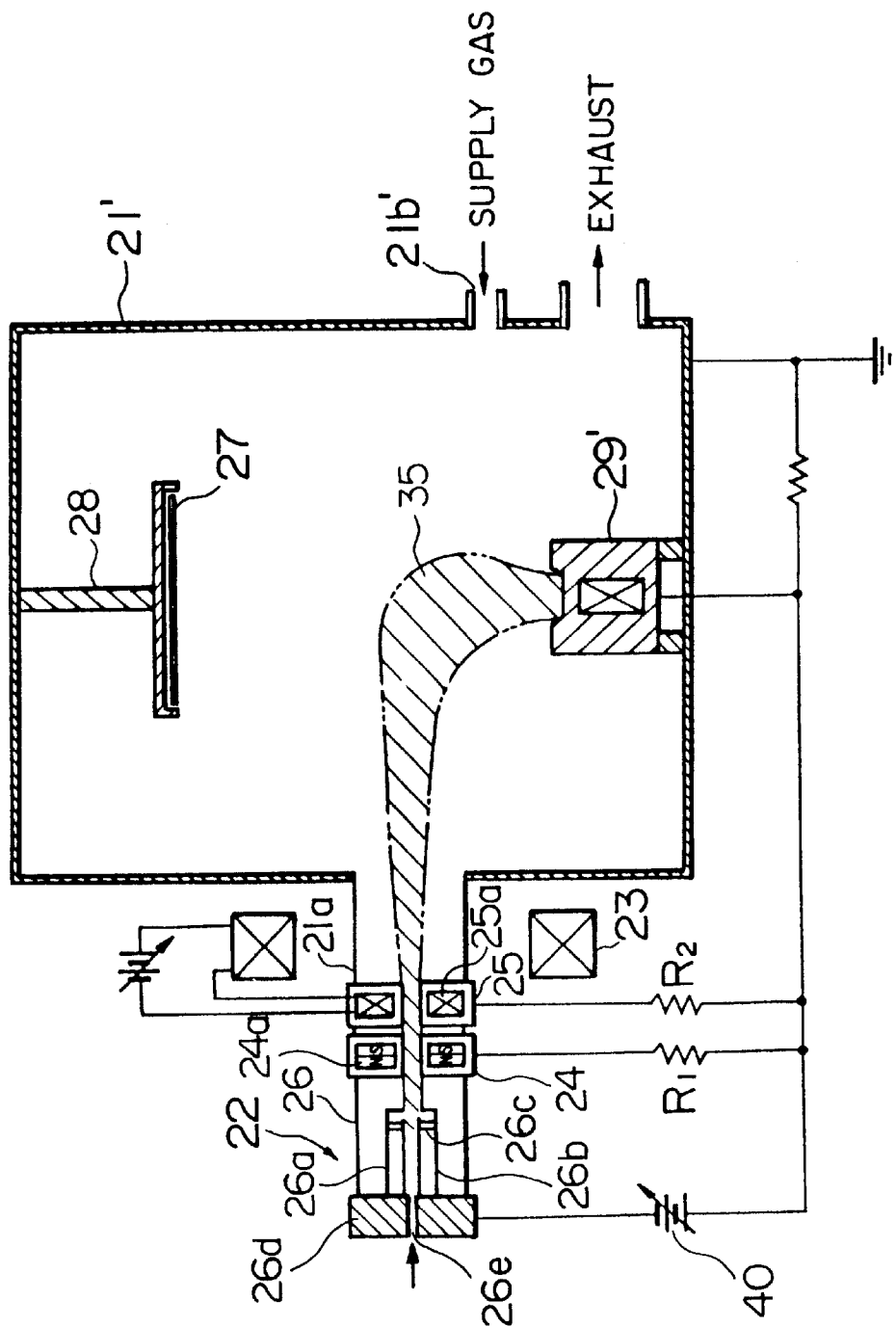
FIG. 2 is a vertical cross-sectional view of a plasma CVD apparatus to which the present invention can be applied.
Figure 3:
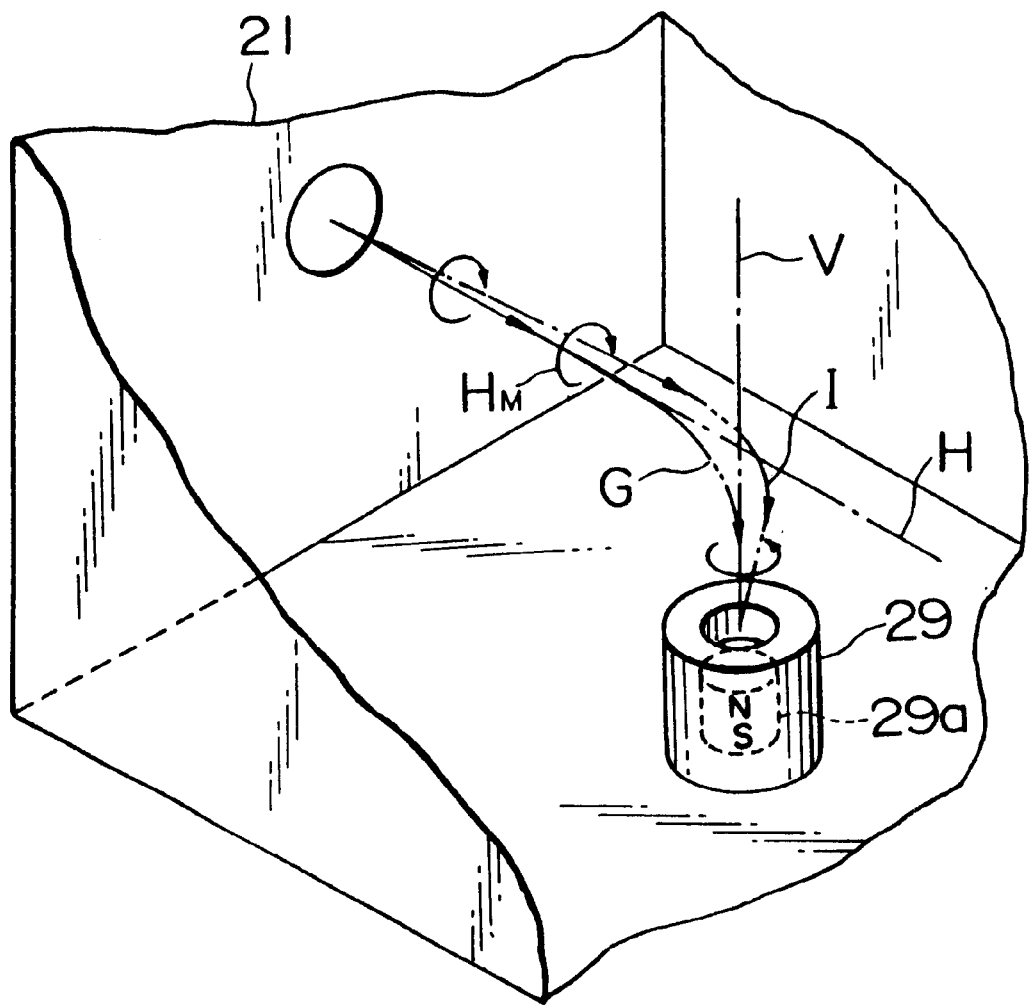
FIG. 3 is a schematic view for use in describing bias of a plasma beam in the ion plating apparatus shown in FIG. 1.

Referring to FIG. 3, bias of the plasma beam 35 is described. For the ion plating apparatus with the plasma source using arc discharge, such as the pressure gradient plasma source or the HCD plasma source, the line of the magnetic force G from the steering coil 23 travels along a horizontal line H and is then turned downward, and along a vertical line V just over the hearth 29 onto the permanent magnet 29a in the hearth 29, when no plasma beam 35 is present. The plasma beam 35, when generated, is guided to the hearth 29 by the steering coil 23. However, the plasma beam 35 carries an electrical current which causes a magnetic field $H_M$. The magnetic field $H_M$ twists or shifts the plasma beam 35. This is true for the plasma CVD apparatus described in conjunction with FIG. 2.

More specifically, the magnetic field $H_M$ acts on the above-mentioned line of magnetic force G to twist the line of the magnetic force I, as shown in FIG. 3. As the output of the plasma beam generator 22 increases, the electrical current in the plasma beam 35 also increases. With the increase of the electrical current, the magnetic field $H_M$ increases. This further twists the line of the magnetic force I. The plasma beam 35 travels along the line of the magnetic force I, so that the plasma beam is also twisted or shifted along with it. As a result, the plasma beam 35 has torsion or bias. Such torsion or bias of the plasma beam 35 prevents its normal incident to the surface of the vaporization material 39. As a result, various troubles may occur. For example, the vaporization material 39 may not evaporate uniformly. The plasma density and/or temperature may be varied in a unit space. This significantly affects the quality of resultant film on the substrate 27. Therefore, any torsion and bias should be corrected. It is known the correction can be achieved by means of adjusting an altitude of the steering coil 23.

However, the conventional steering coil 23 is not permanently fixed. Instead, it is supported by a supporting member through a shim. The thickness and/or the number of the shim are/is varied depending on the necessity to adjust finely the altitude of the steering coil 23. The adjustment of the steering coil 23 requires significant labor because of its large weight.

Figure 4:
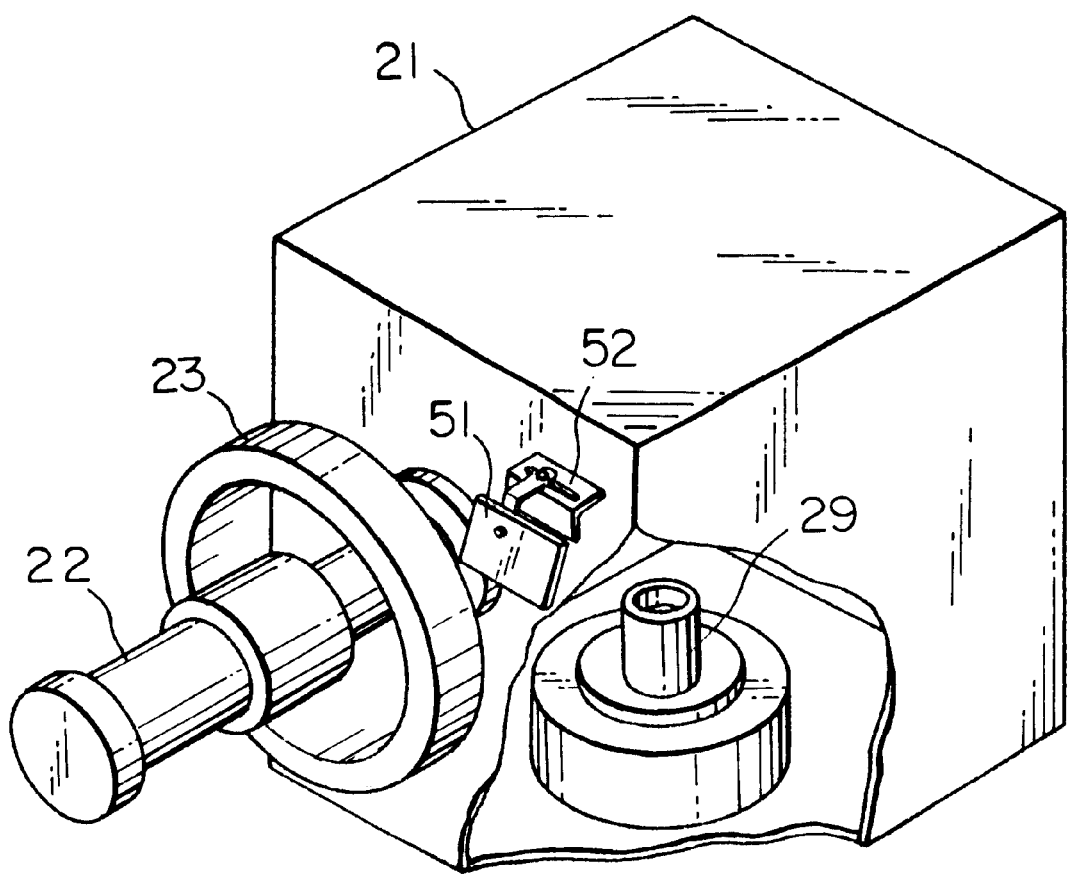
FIG. 4 is a partially cross-sectional outside view showing schematically a vacuum film growth apparatus implementing the present invention.

Referring to FIG. 4, a vacuum film growth apparatus according to a preferred embodiment of the present invention is described. A feature of the vacuum film growth apparatus according to the preferred embodiment of the present invention is a correction mechanism for correcting torsion and/or bias of the plasma beam 35. The correction mechanism can be applied to both the ion plating apparatus in FIG. 1 and the plasma CVD apparatus in FIG. 2. Therefore, the following description is made only for the correction mechanism and those for the internal construction of the vacuum film growth apparatus are omitted.

In FIG. 4, the vacuum chamber 21 is equipped with the plasma beam generator 22 as described above. The vacuum chamber 21 has the hearth 29 placed therein that serves as the anode. The steering coil 23 is arranged around the plasma beam generator 21 outside the vacuum chamber 21. The plasma beam 35 generated by the plasma beam generator 22 is guided onto the hearth 29. In FIG. 4, the hearth 29 and the peripheries thereof are illustrated schematically but are similar to those described in conjunction with FIG. 1.

As apparent from FIG. 4, a magnetic body 51 is placed between the steering coil 23 and the vacuum chamber 21 where the line of magnetic force from the steering coil 23 is present, to correct the bias of the plasma beam 35. In particular, the magnetic body 51 is provided by a mounting plate 52 such that it is movable in two or more directions. The mounting plate 52 may be attached to any one of the vacuum chamber 21, the plasma beam generator 22, and the steering coil 23, provided that the magnetic body 51 is on the line of the magnetic force from the steering coil 23.

Figure 5:
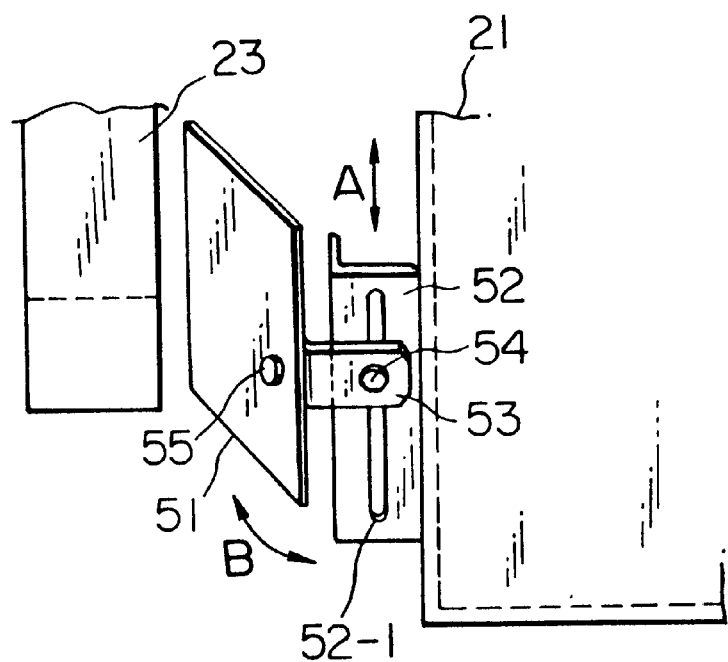
FIG. 5 is a plan view showing an example of a correction mechanism for the plasma beam according to the present invention.
Figure 6:
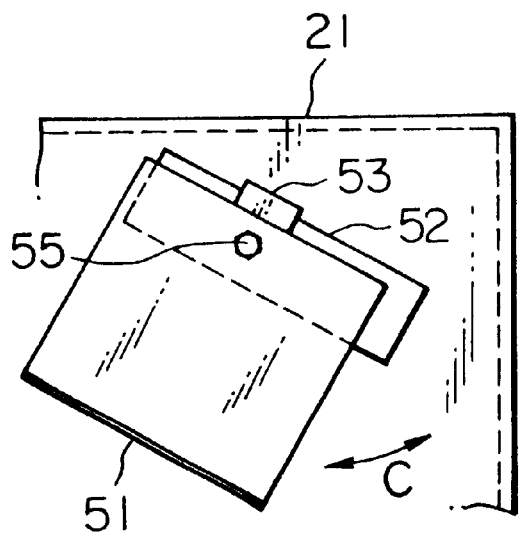
FIG. 6 is a front view of the correction mechanism in FIG. 5 in the perspective from the steering coil.
Figure 7:
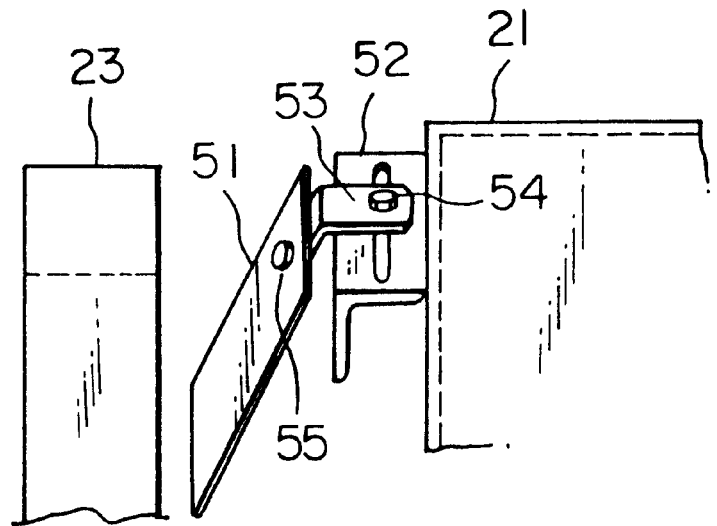
FIG. 7 is a side view of the correction mechanism in FIG. 5.

Referring to FIGS. 5 through 7, the mounting plate 52 is attached to the outer wall of the vacuum chamber 21 with being slightly inclined with respect thereto. A main surface of the mounting plate 52 has an elongate slot 52-1 formed thereto. The magnetic body 51 is attached to the mounting plate 52 through a supporting member 53 with a bolt and a nut. More specifically, a bolt 54 is passed through the supporting member 53. The bolt 54 also passes through the elongate slot 52-1. A nut (not shown) is threadedly engaged with the bolt 54 on the back of the mounting plate 52. The supporting member 53 thus fixed to the mounting plate 52 with the bolt 54 and the nut. The supporting member 53 is movable in the direction of an arrow A (FIG. 5) along the elongate slot 52-1 by means of loosing the nut. The supporting member 53 is rotatable in the direction of an arrow B (FIG. 5) about a central axis of the bolt 54.

The magnetic body 51 is attached to the supporting member 53 with a bolt 55. More specifically, the bolt 55 passes through the magnetic body 51 and the supporting member 53. A nut (not shown) is threadedly engaged with the bolt 55 on the back of the supporting member 53. The magnetic body 51 is rotatable in the direction of an arrow C (FIG. 6) about a central axis of the bolt 55 by means of loosing the nut.

The plasma beam 35 generated by the plasma beam generator 22 is guided by the magnetic field of the steering coil 23 into the hearth 29. At that time, the magnetic field is produced due to the electrical current of the plasma beam 35. The magnetic field due to the electric current affects the magnetic field of the steering coil 23 and shifts the plasma beam 35. With this respect, the magnetic body 51 is placed to affect that magnetic flux at the position where the magnetic flux that contributes to the guiding of the plasma beam passes. The magnetic flux that contributes to the guiding of the plasma beam 35 is the one present on the side closer to the vacuum chamber 21 rather than the steering coil 23. The magnetic body 51 changes the magnetic flux guiding the plasma beam 35 to correct the bias of the plasma beam 35.

Figure 8A:
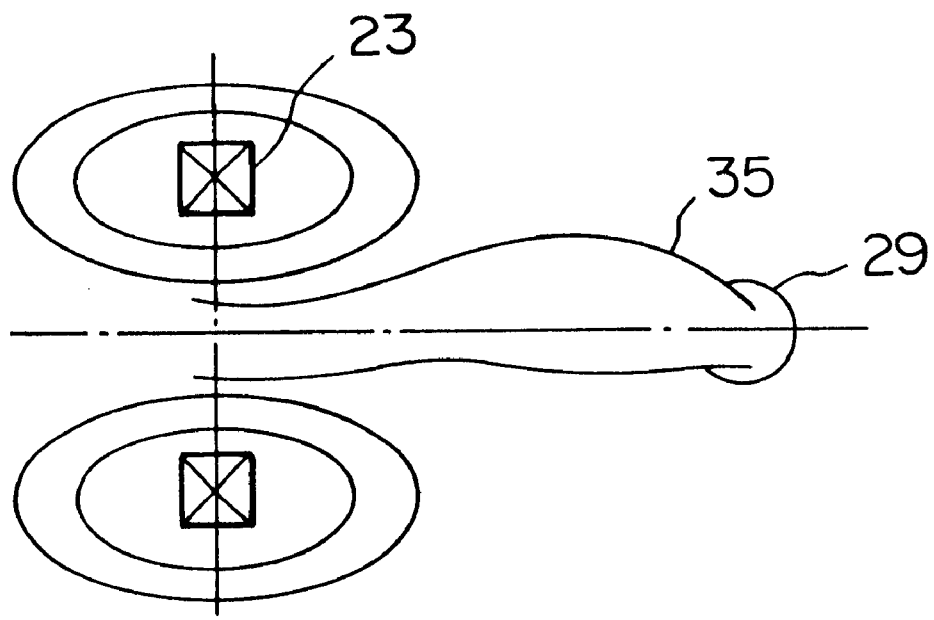
FIGS. 8A and 8B are views for use in describing torsion of the plasma beam and correction thereof.
Figure 8B:
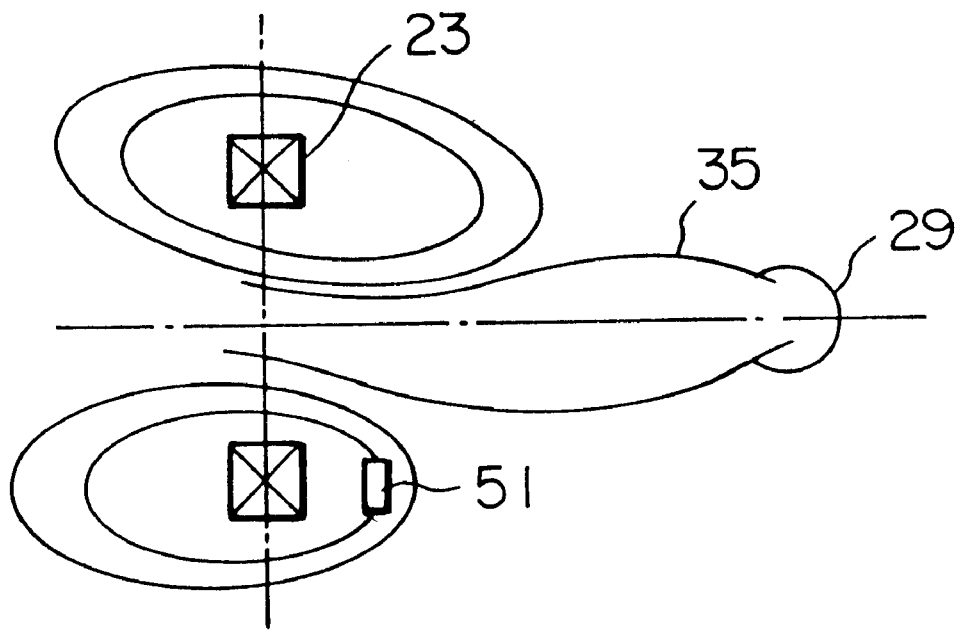

For example, as shown in FIG. 8A, the plasma beam 35 from the plasma beam generator 22 is directed to the hearth 29 with a certain torsion angle with respect to the normal. The magnetic body 51 is placed opposite to the torsion of the plasma beam 35, as shown in FIG. 8B. Then, the line of the magnetic force around the magnetic body 51 changes. This change affects the line of the magnetic force on the opposite side. As a result, the line of the magnetic force on the opposite side less constrains the plasma beam 35. In this way, the bias of the plasma beam 35 is corrected.

As described above, the magnetic body 51 is placed a position between the steering coil 23 and the vacuum chamber 21 where the line of the magnetic force from the steering coil 23 is present. The position of the magnetic body 51 can be adjusted, if necessary and the position after such adjustment can be fixed positively. If the bias occurs in the plasma beam 35, then the position of the magnetic body 51 may be adjusted to correct it, observing the bias through, for example, a window formed in the vacuum chamber 21.

While the above-mentioned embodiment has thus been described in conjunction with the case where the magnetic body 51 is attached to the vacuum chamber 21 through the mounting plate 52 and the supporting member 53, the magnetic body 51 itself may be attached to the vacuum chamber 21 directly with a portion of the magnetic body 51 being used as a mounting portion.

Figure 9:
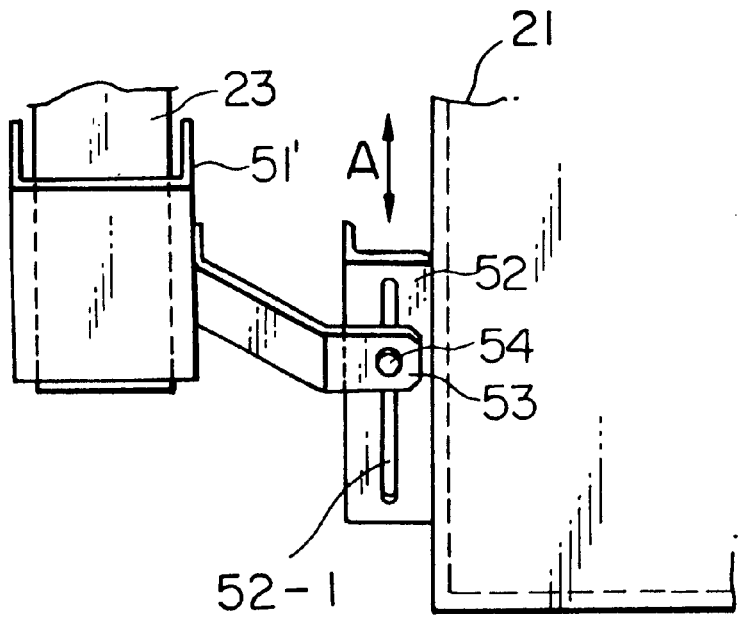
FIG. 9 is a plan view showing a modification of the correction mechanism in FIG. 5.

Referring to FIG. 9, a modification of the above-mentioned embodiment is described. The modification comprises a magnetic body 51' having a generally U shape which covers a portion of the steering coil 23. The magnetic body 51' is fixed to the supporting member 53. The magnetic body 51' is fixed to the supporting member 53. The magnetic body 51' and the supporting member 53 are fixed with the bolt 54 and the nut through the elongate slot 52-1.

While the above-mentioned embodiment is implemented in the ion plating apparatus as shown in FIG. 1, it is equally applicable to the plasma CVD apparatus as shown in FIG. 2.

As described above, the vacuum film growth apparatus according to the present invention has the magnetic body placed on the steering coil or other position between the steering coil and the vacuum chamber where the line of the magnetic force generated by the steering coil is present. The position of the magnetic body can be adjusted freely, if necessary, and the position after the adjustment can be fixed positively. The bias of the plasma beam, if any, can be corrected easily only by means of adjusting the magnetic body. A film of high-quality can thus be formed on the substrate.

What is claimed is:

1. A vacuum film growth apparatus comprising:

a vacuum chamber, a plasma source attached to said vacuum chamber, an anode placed in said vacuum chamber, a steering coil provided outside said vacuum chamber to guide a plasma beam generated by said plasma source into said anode, and a correction mechanism comprising a magnetic body placed adjacent to said steering coil or another position between said steering coil and said vacuum chamber where the magnetic flux generated by said steering coil is affected by the magnetic body of the correction mechanism to change a part of said magnetic flux of said steering coil in order to correct torsion of said plasma beam, wherein said plasma beam is guided to said anode to form a film on a substrate, and wherein said correction mechanism further comprises a mounting plate for mounting said magnetic body thereto, said magnetic body being attached to said mounting plate such that said magnetic body is shifted in three or more directions.

2. A vacuum film growth apparatus as claimed in claim 1, wherein said mounting plate is attached to an outer wall of said vacuum chamber.

3. A vacuum film growth apparatus as claimed in claim 1, wherein said plasma beam is guided to a vaporization material placed on said anode to ionize said vaporization material, thereby depositing ionized particles of said vaporization material onto said substrate to form a film thereon.

4. A vacuum film growth apparatus as claimed in claim 1, wherein said plasma beam is guided to a vaporization material placed on said anode to ionize said vaporization material.

* * * * *